US008847476B2

(12) United States Patent
Wang

(10) Patent No.: US 8,847,476 B2
(45) Date of Patent: Sep. 30, 2014

(54) ELECTRON INJECTION NANOSTRUCTURED SEMICONDUCTOR MATERIAL ANODE ELECTROLUMINESCENCE METHOD AND DEVICE

(75) Inventor: Deli Wang, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 292 days.

(21) Appl. No.: 13/132,297

(22) PCT Filed: Dec. 4, 2009

(86) PCT No.: PCT/US2009/066782
§ 371 (c)(1),
(2), (4) Date: Aug. 23, 2011

(87) PCT Pub. No.: WO2010/065860
PCT Pub. Date: Jun. 10, 2010

(65) Prior Publication Data
US 2011/0297846 A1 Dec. 8, 2011

Related U.S. Application Data

(60) Provisional application No. 61/119,938, filed on Dec. 4, 2008, provisional application No. 61/121,333, filed on Dec. 10, 2008.

(51) Int. Cl.
 H01J 1/62 (2006.01)
 H01J 63/04 (2006.01)
 H01J 63/06 (2006.01)
 H01L 33/50 (2010.01)

(52) U.S. Cl.
 CPC ............. *H01J 63/06* (2013.01); *H01L 33/502* (2013.01)
 USPC ........... 313/498; 313/495; 313/496; 313/311; 313/309

(58) Field of Classification Search
 USPC .......................... 313/309, 486, 496, 498, 501
 See application file for complete search history.

(56) References Cited

U.S. PATENT DOCUMENTS 4,408,141 A 10/1983 Byszewski et al.
(Continued)

FOREIGN PATENT DOCUMENTS

CN 101223627 7/2008
(Continued)

OTHER PUBLICATIONS

An, S, J.; Park, W.; Yi, G.-C. "Heteroepitaxal fabrication and structural characterization of ultrafine GaN/ZnO coaxial nanorod heterostructures", *Appl. Phys. Lett.*, 84, 3612, 2004.
(Continued)

*Primary Examiner* — Sikha Roy
(74) *Attorney, Agent, or Firm* — Greer, Burns & Crain, Ltd.

(57) ABSTRACT

Embodiments of the invention include methods and devices for producing light by injecting electrons from field emission cathode across a gap into nanostructured semiconductor materials, electrons issue from a separate field emitter cathode and are accelerated by a voltage across a gap towards the surface of the nanostructured material that forms part of the anode. At the nanostructure material, the electrons undergo electron-hole (e-h) recombination resulting in electroluminescent (EL) emission. In a preferred embodiment lighting device, a vacuum enclosure houses a field emitter cathode. The vacuum enclosure also houses an anode that is separated by a gap from said cathode and disposed to receive electrons emitted from the cathode. The anode includes semiconductor light emitting nano structures that accept injection of electrons from the cathode and generate photons in response to the injection of electrons. External electrode contacts permit application of a voltage differential across the anode and cathode to stimulate electron emissions from the cathode and resultant photon emissions from the semiconductor light emitting nanostructures of the anode. Embodiments of the invention also include the usage of nanostructured semiconductor materials as phosphors for conventional planar LED and nanowire array light emitting diodes and CFL. For the use in conventional planar LEDs, the nanostructures may take the form of quantum dots, nanotubes, branched tree-like nanostructure, nanoflower, tetrapods, tripods, axial heterostructures nanowires hetero structures.

33 Claims, 8 Drawing Sheets

(56) References Cited

U.S. PATENT DOCUMENTS

| | | |
|---|---|---|
| 5,212,426 A | 5/1993 | Kane |
| 5,442,254 A | 8/1995 | Jaskie |
| 5,455,489 A | 10/1995 | Bhargava |
| 5,882,779 A | 3/1999 | Lawandy |
| 6,008,575 A | 12/1999 | Kaftanov et al. |
| 6,168,282 B1 | 1/2001 | Chien |
| 7,118,928 B2 | 10/2006 | Steckl et al. |
| 7,307,271 B2 | 12/2007 | Islam et al. |
| 7,600,888 B1* | 10/2009 | Miller ............... 362/225 |
| 7,687,800 B1* | 3/2010 | Kar et al. ............ 257/14 |
| 2003/0089899 A1 | 5/2003 | Lieber et al. |
| 2003/0205966 A1 | 11/2003 | Chen et al. |
| 2004/0213307 A1* | 10/2004 | Lieber et al. ........... 372/39 |
| 2005/0009224 A1* | 1/2005 | Yang et al. ............ 438/57 |
| 2005/0161662 A1* | 7/2005 | Majumdar et al. ....... 257/18 |
| 2005/0194889 A1* | 9/2005 | Chen et al. ........... 313/495 |
| 2005/0208302 A1* | 9/2005 | Yi et al. ............... 428/402 |
| 2005/0212402 A1* | 9/2005 | Haba et al. ............ 313/496 |
| 2006/0049425 A1 | 3/2006 | Nause et al. |
| 2006/0060933 A1 | 3/2006 | Gao et al. |
| 2006/0125056 A1 | 6/2006 | Samuelson et al. |
| 2006/0175601 A1 | 8/2006 | Lieber et al. |
| 2006/0244357 A1 | 11/2006 | Lee |
| 2007/0018558 A1* | 1/2007 | Chua et al. ............ 313/485 |
| 2007/0045660 A1* | 3/2007 | Yi et al. ............... 257/183 |
| 2007/0102723 A1 | 5/2007 | Nause et al. |
| 2007/0181906 A1 | 8/2007 | Chik et al. |
| 2007/0194694 A1* | 8/2007 | Reddy ............... 313/503 |
| 2007/0235738 A1* | 10/2007 | Jin et al. ............ 257/79 |
| 2007/0281156 A1 | 12/2007 | Lieber et al. |
| 2008/0036038 A1 | 2/2008 | Hersee et al. |
| 2008/0149944 A1 | 6/2008 | Samuelson et al. |
| 2008/0185604 A1 | 8/2008 | Kim |
| 2008/0191196 A1* | 8/2008 | Lu et al. ............ 257/27 |
| 2008/0303405 A1* | 12/2008 | Lu et al. ............ 313/495 |
| 2009/0057650 A1 | 3/2009 | Lieber et al. |
| 2009/0128002 A1* | 5/2009 | Hu ............... 313/496 |
| 2009/0167146 A1* | 7/2009 | Yang et al. ............ 313/495 |
| 2009/0230497 A1 | 9/2009 | Gao et al. |
| 2009/0256148 A1 | 10/2009 | Park et al. |
| 2009/0273298 A1* | 11/2009 | Yang et al. ............ 315/265 |
| 2010/0155698 A1 | 6/2010 | Lieber et al. |
| 2010/0295019 A1 | 11/2010 | Wang et al. |
| 2011/0108873 A1 | 5/2011 | Richardson et al. |
| 2011/0163292 A1 | 7/2011 | Wang et al. |

FOREIGN PATENT DOCUMENTS

| | | |
|---|---|---|
| JP | 2004-152591 | 5/2004 |
| JP | 2006-120586 | 5/2006 |
| JP | 2008-198614 | 8/2008 |
| KR | 10-2006-0105069 | 10/2006 |
| KR | 2007-0048413 | 5/2007 |
| WO | WO 2005-074006 | 8/2005 |
| WO | WO 2006-066111 | 6/2006 |
| WO | WO 2007-003316 | 1/2007 |
| WO | WO 2007-007954 | 1/2007 |
| WO | WO 2008-098008 | 8/2008 |
| WO | WO 2008-098013 | 8/2008 |
| WO | WO 2010-062644 | 6/2010 |

OTHER PUBLICATIONS

Barrelet C; J, Wu, Y.; Bell, D. C.; Lieber, C. M. "Synthesis of CdS and ZnS Nanowires Using Single-Source Molecular Precursors", *J Am. Chem. Soc.*, 125, 11498-11499, 2003.

Bjork, M. T.; Ohlsson, B. J.; Sass, T.; Persson, A.; Thelander, C.; Magnusson, M. H.; Deppert, K.; Wallenberg, L. R.; Samuelson, L.; "One-dimensional steeplechase for electrons realized," *Nano Letters*, 2(2), 87-89, 2002.

Cul Y.; Duan, X.; Hu, J.; Lieber, C. M. "Doping and Electrical Transport in Silicon Nanowires", *J. Phys. Chem. B*, 104, 5213-5216, 2000.

Cui, Y.; Lauhon, L. J.; Gudiksen, M. S.; Wang, J.; Lieber, C. M. "Diameter-Controlled Synthesis of Single-crystal Silicon Nanowires" *Appl. Phys Lett.*, 78,2214, 2001.

Duan, X.; Lieber, C. M. "General Synthesis of Compound Semiconductor Nanowires" *Adv. Mater.* 12, 298-302, 2000.

Duan, X.; Huang, Y.; Cui, Y.; Wang, J.; Lieber, C. M. "Indium Phosphide Nanowires as Building Blocks for Nanoscale Electronic and Optoelectronic Devices," *Nature*, 409, 66-69, 2001.

Duan, X.; Huang, Y.; Agarwai. R.; Lieber, C. M. "Single-Nanowire Electrically Driven Lasers," *Nature*, 421, 241-245, 2003.

Gudiksen, M. S.; Lauhon, L. J.; Wang, J.; Smith, D. C.; Lieber, C. M. "Growth of nanowire superlattice structures for nanoscale photonics and electronics," *Nature*, 415, 617-620, 2002.

Kim, H.-M.; Cho, Y.-H.; Lee, H.; Kim, S.; Ryu, S. R.; Kim, D. Y.; Kang, T. W.; Chung, K. S. "High-Brightness Light Emitting Diodes Using Dislocation-Free Indium Gallium Nitride/Gallium Nitride Multiquantum-Well Nanorod Arrays" *Nano Let.*, 4(6), 1059-1062, 2004.

Lauhon, L. J.; Gudiksen, M. S.; Wang, D.; Lieber, C. M. "Epitaxial core-shell and core-multi-shell nanowire heterostructures", *Nature*, 420, 57-61, 2003.

Lieber, C. M. "Nanowire Superlattices," *Nano Lett.*, 2(2), 81-82, 2002.

Panev, N,; Persson, A. I.; Sköld, N.; and Samuelson. L., "Sharp exciton emission from single InAs quantum dots in GaAs nanowires", *Appl. Phys. Lett.*, 83, 2238, 2003.

Quian, F., Y. Li, S. Gradečak, D. Wang, C. J. Barrelet, and C. M. Lieber, "Gallium Nitride-Based Nanowire Radial Heterostructures for Nanophotonics," *Nano Lett.*, 4, 1975 (2004).

Qian, F., S. Gradečak, Y. Li, C. Y. Wen and C. M. Lieber,"Core/Multishell Nanowire Heterostructures as Multicolor, High-Efficiency Light-Emitting Diodes," *Nano Lett.* 5, 2287 (2005).

Wang, D. and C. M. Lieber, "Inorganic Materials: Nanocrystals Branch Out", *Nature Mater*,. 2, 355-356 (2003).

Wang, D., F. Qian, C. Yang, Z. Zhong, and C. M. Lieber, "Rational Growth of Branched and Hyper-branched Nanowire Structures", *Nano Lett.*, 4(5), 871-874 (2004).

Wu, Y.; Fan, R.; Yang, P.; "Block-by-Block Growth of Single-Crystalline Si/SiGe Superlattice Nanowires," *Nano Letters*, 2(2), 83-86, 2002.

Xiang, B., D. Wang, et al, "Rational synthesis of p-type Zinc Oxide nanowire arrays using simple chemical vapor deposition," *Nano Lett.*, vol. 7, No. 2, 2007, pp. 323-328.

Yin, L. W.; Bando, Y.; Zhu, Y.-C.; Golberg, D.; Li, M.-S. "Synthesis of InN/InP core/sheath nanowires", *Appl. Phys. Lett.* 84(9), 1546-1548, 2004.

Zhong, Z.; Qian, F.; Wang, D.; Lieber, C. M.; "Synthesis of p-Type Gallium Nitride Nanowires for Electronic and Photonic Nanodevices", *Nano Lett.* 3, 343-346, 2003.

Zwiller, V. et al., "Optics with single nanowires", *C.R. Physique*, 9 (2008) p. 804-815.

\* cited by examiner

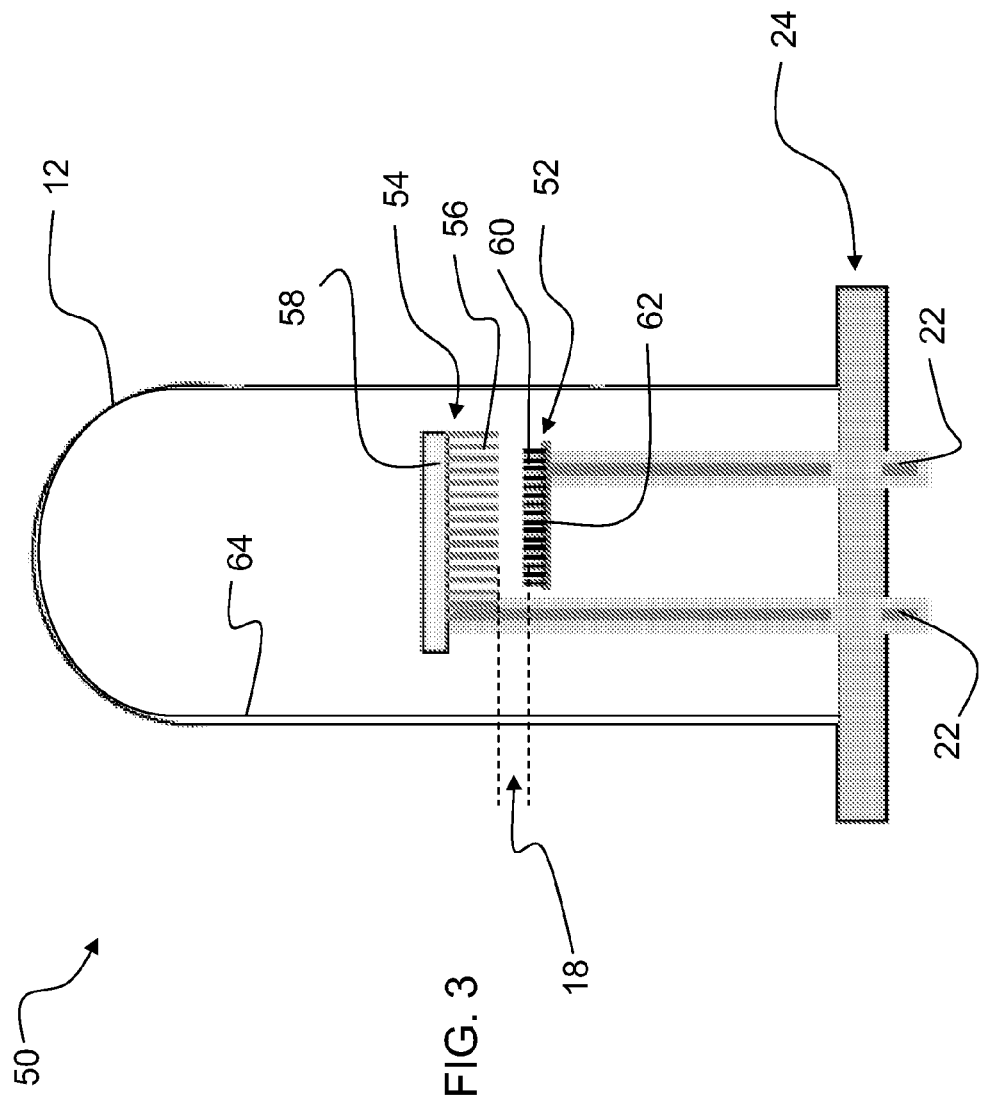

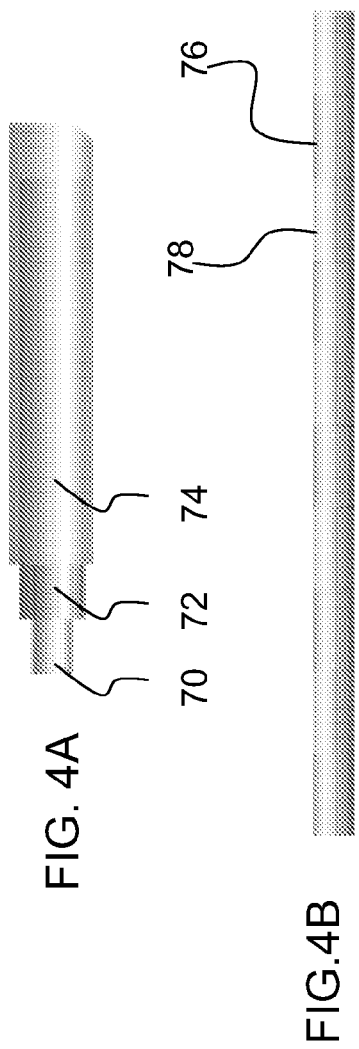
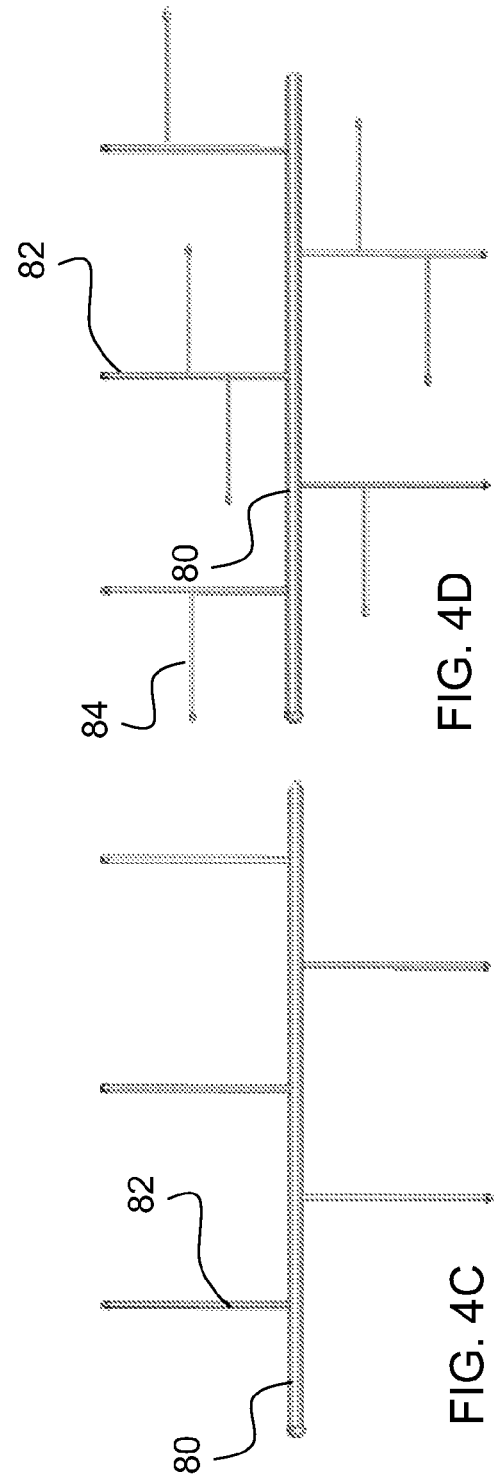
FIG. 4A
FIG. 4B
FIG. 4C
FIG. 4D

ELECTRON INJECTION NANOSTRUCTURED SEMICONDUCTOR MATERIAL ANODE ELECTROLUMINESCENCE METHOD AND DEVICE

PRIORITY CLAIM AND REFERENCE TO RELATED APPLICATION

The application claims priority under 35 U.S.C. §119 from prior U.S. provisional application Ser. No. 61/119,938, which was filed on Dec. 4, 2008 and from prior U.S. provisional application Ser. No. 61/121,333, which was filed on Dec. 10, 2008.

FIELD

A field of the invention is electricity to light energy conversion. Applications of the invention include lighting and displays.

BACKGROUND

Meeting the challenge of increasing worldwide demand for energy requires strategies for more efficient energy use as well as sustainable approaches to energy generation and conservation. Lighting is a major contributor to electricity consumption, accounting for 19% of global use and 34% for the U.S. The U.S. lighting market is currently divided among various lamp types as follows: 63% incandescent, 35% fluorescent, 2% halogen. The incandescent light bulb is only 5% efficient (15 lm/W) while the fluorescent lamp has 15-25% efficiency (50-80 lm/W).

Solid-state luminaires, which are typically based on light-emitting diodes (LEDs), have the potential to revolutionize the lighting industry with higher efficiency, better quality and lower maintenance, possibly leading to a reduction by half of energy consumed by general illumination. For example, 30% efficiency (100 lm/W at 350 mA) has been achieved in a commercially available white LED and 50% (150 lm/W at 20 mA) in a laboratory white LED device. The appreciable energy savings that come with converting from incandescent to fluorescent lamps (including compact fluorescent lamps or CFLs) and solid-state lighting has motivated many national governments to pass regulations that phase out the use of incandescent lights.

Traditional incandescent light sources are favored by many people because they provide a broad spectrum of incoherent light that produces a pleasing white light. A given LED, on the other hand, emits light of a specific color determined by the bandgap of the semiconductor material constituting the LED. One approach for producing white light is to use multiple LEDs of different colors—red (R), green (G), and blue (B).

Another approach is to use phosphors to transform blue or near-UV light from an LED, e.g., a GaN-based LED, to "pump" a phosphor or mixture of phosphors. The multiple LED approach leads to narrow spectral lines and limited in practice by the low efficiency of green LEDs. On the other hand, conventional blue LEDs coated with yellow phosphors give a cold white light, and are not color tunable. Some have used alternate sources for wavelength conversion with LEDs. An example wavelength conversion LED strategy is disclosed in Kim, US Patent Publication No. 2008/0185604, published on Aug. 7, 2008 Kim discloses a light emitting diode that emits in an ultraviolet, blue or green wavelength range. Linear homogenous nanowire or linear core shell nanowire phosphors convert light from the diode into a longer wavelength.

Another problem with solid state lighting based upon traditional light emitting diode structures is that the traditional solid state LEDs don't fit the power model that has been implemented for incandescent lighting. The power grid is a design that has a high voltage but low current power supply philosophy. Residential and business electrical services typically is defined by 110V or 220V service in the United States, and similar conventions are used in other parts of the world. An ideal suitable replacement for conventional general lighting would serve as a replacement for incandescent bulbs and meet the voltage and current limitations of standard residential or business services without need to resort to transformers requiring large step ups in either current or voltage. Compact fluorescent bulbs are a successful commercial product that meets this need, but many find their spectrum to be less pleasing than traditional incandescent sources. The compact fluorescent lamps also pose environmental and health risks because they contain mercury.

Traditional cathode ray tubes and similar devices use electrons to stimulate conventional phosphors, typically transition metal or rare earth compounds. The conventional phosphors limit efficiency because the phosphors must dissipate charge by emitting a photon before accepting additional energy.

SUMMARY OF THE INVENTION

Embodiments of the invention include methods and devices for producing light by injecting electrons from field emission cathode across a gap into nanostructured semiconductor materials. Electrons issue from a separate field emitter cathode and are accelerated by a voltage across a gap towards the surface of the nanostructured material that forms part of the anode. At the nanostructure material, the electrons undergo electron-hole (e-h) recombination resulting in a highly efficient electroluminescent (EL) emission. In a preferred embodiment lighting device, a vacuum enclosure houses a field emitter cathode. The vacuum enclosure also houses an anode that is separated by a gap from said cathode and disposed to receive electrons emitted from the cathode. The anode includes semiconductor light emitting nanostructures that accept injection of electrons from the cathode and generate photons in response to the injection of electrons. External electrode contacts permit application of a voltage differential across the anode and cathode to stimulate electron emissions from the cathode and resultant photon emissions from the semiconductor light emitting nanostructures of the anode.

Embodiments of the invention also include the usage of nanostructured semiconductor materials as phosphors for conventional planar LED and nanowire array light emitting diodes and CFL. For the use in conventional planar LEDs, the nanostructures may take the form of quantum dots, nanotubes, branched tree-like nanostructure, nanoflower, tetrapods, tripods, axial heterostructures nanowires heterostructures.

BRIEF DESCRIPTION OF THE DRAWINGS

FIGS. 1-3 illustrate preferred embodiment lighting devices having an electron emitting cathode and a semiconductor nanostructure light emission anode in accordance with the invention;

FIGS. 4A-4D illustrate different types of light emitting nanowire heterostrucures that can be used in the anode of devices of the invention.

DETAILED DESCRIPTION OF THE PREFERRED EMBODIMENTS

Figure 1A:
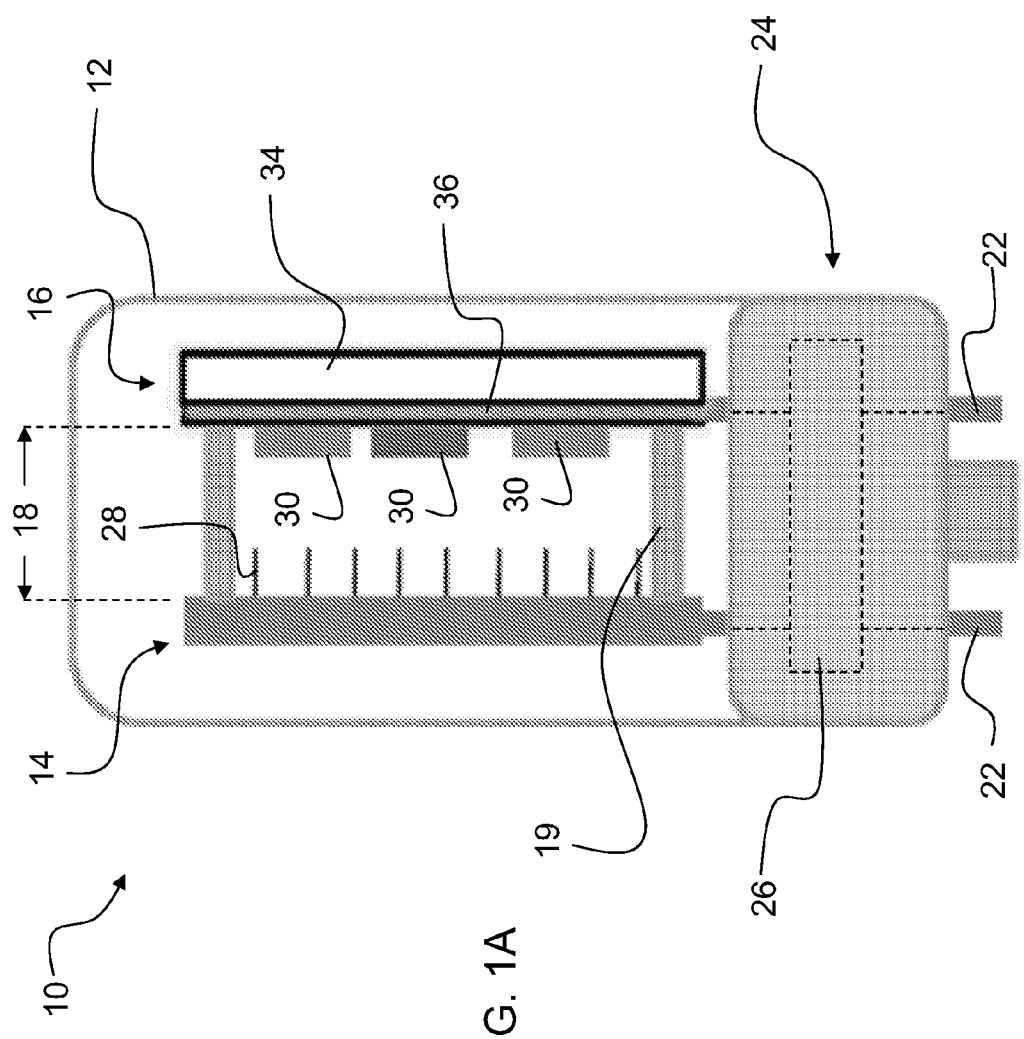

Embodiments of the invention include methods and devices for producing light by injecting electrons from field emission cathode across a gap into nanostructured semiconductor materials. In methods and devices of the invention, light is not generated by the passing of electrons through a p/n junction, as occurs in conventional light-emitting diodes (LEDs). Instead, the electrons issue from a separate field emitter cathode and are accelerated by a voltage across a gap towards the surface of the nanostructured material that forms part of the anode. At the nanostructure material, the electrons undergo electron-hole (e-h) recombination resulting in a highly efficient electroluminescent (EL) emission.

In a preferred embodiment lighting device, a vacuum enclosure houses a field emitter cathode. The vacuum enclosure also houses an anode that is separated by a gap from said cathode and disposed to receive electrons emitted from the cathode. The anode includes semiconductor light emitting nanostructures that accept injection of electrons from the cathode and generate photons in response to the injection of electrons. External electrode contacts permit application of a voltage differential across the anode and cathode to stimulate electron emissions from the cathode and resultant photon emissions from the semiconductor light emitting nanostructures of the anode.

Lighting devices of the invention can provide numerous advantages. Devices of the invention provide high emission and high light extraction efficiency that results in high brightness with low energy consumption. Devices of the invention provide low operational temperature compared to incandescent light bulb. Rich color options are possible (RGBW), better than conventional LEDs and significantly greater relative to CFL light bulbs and incandescent light bulb. Devices of the invention can provide dimming, are modular and scalable, are mercury free and environmentally cleaner than CFL light bulbs, and provide simpler device fabrication compared to thin film LEDs, can be manufactured inexpensively, and will provide a long operational life compared to incandescent light bulb (estimated 10×) and CFL (estimated 2×). Applications for devices of the invention include general lighting, electric signs, as a light emitting diode substitute, solid state lighting, traffic lights, automobiles, back-lighting for displays, UV LED for water treatment, blue LEDs and laser diodes for data storage, information processing, and telecommunication applications operating in the IR (1300 nm or 1550 nm wavelength).

A light emission device of the invention can far exceed the efficiencies that have been obtained with known solid state light sources, and it is estimated that an efficiency of about 90% (40-150 lm/W) can be achieved with preferred embodiment devices. Preferred embodiment devices can take the form of a traditional light bulb and operate with a traditional high voltage, low current power source. Fabrications that set an appropriate gap between the anode and cathode hold promise to permit operation at standard voltages without a transformer. Field emission from a preferred carbon nanotube field emitter generally requires a voltage of about 1V/micron, so an approximate 110 micron gap permits operation at 110 V. Devices of the invention can be made as modular units, and can be scaled up for use in general lighting and many applications such as displays, camera flash, keypad products and backlighting. In preferred embodiments, a gap of about 50-200 microns is used. The gap will depend upon the materials and pressures within the enclosure. Gaps up to 10 mm may be possible for a given pressure within the vacuum enclosure which is 10e-5 Torr or better, which is also matched with a transformer/ballast used.

In a preferred embodiment, an electroluminescent anode assembly include Group III-V nanowires on a surface of ITO on a glass substrate. The nanowire dimensions (radius, length) can be optimized to obtain the desired relative facet/lateral surface contributions to provide wave-guided emission. The nanowire arrangement and orientation can be selected such that a) the electron flux from the cathode optimally covers the nanowires surface; and/or b) maximizes the light exiting unobstructed from the end facets or lateral surface.

The anode and cathode in preferred embodiments are axially or radially disposed parallel plates. In another exemplary embodiment, the injection light emitting diode includes cathode and anode assemblies arranged in cylindrical analog of the parallel plate geometry of the first exemplary embodiment described above. That is, instead of parallel plates, we have concentric cylinders such that the inner cylinder is the cathode/electron emitter assembly and the outer cylinder the anode/electroluminescent assembly. The preferred characteristics (components of cathode and anode assembly, approaches to color tuning, dimensions etc) for this concentric cylinder embodiment would be analogous to those of the parallel plate embodiments.

Preferred embodiment injection light emitting devices are anticipated to perform according to the performance parameters or better >90% electron to photon conversion, ~100% light extraction, 98% transmission of glass (90.7% transmittance, 1.8% absorbance, 7.5% reflection); Efficacy: 40-150 or more L/W, Total Brightness: 500-1000 L, Operating Temperature: Cool (<50C), Color (CRI): Excellent (92), Lifetime: >50,000 hours, Input Power: 6W @ 150 L/W, and Output 900 L.

Preferred embodiments of the invention will now be discussed with respect to the drawings. The drawings may include schematic representations, which will be understood by artisans in view of the general knowledge in the art and the description that follows. Features may be exaggerated in the drawings for emphasis, and features may not be to scale.

FIG. 1A illustrates preferred embodiment lighting device 10. The device includes a vacuum enclosure 12 that houses a field emitter cathode 14. The vacuum enclosure 12 also houses an anode 16 that is separated by a gap 18 from the cathode and disposed to receive electrons emitted from the cathode. The gap 18 is set by a insulating spacer 19. The anode 16 includes semiconductor light emitting nanostructures 30 that accept injection of electrons from the cathode 14 and generate photons in response to the injection of electrons. External electrode contacts 22 permit application of a voltage differential across the anode 16 and cathode 14 to stimulate electron emissions from the cathode and resultant photon emissions from the semiconductor light emitting nanostructures of the anode. The vacuum enclosure 12 and a base 24 may take the form of a standard light bulb, and while the electrodes 22 are illustrated as prongs, a conventional screw-in socket connection can also be used. The base 24 can house a transformer 26, if a transformer is necessary to convert power from an external power supply. Tunneling electron emitters can be used to form the cathode 14, as can electron emitting nanostructures. In the FIG. 1A embodiment, example nanostructured electron emitters are preferred vertical carbon nanotubes 28. In one exemplary embodiment, the injection light emitting anode is an arrangement of a planar cathode assembly facing a parallel planar anode assembly with electroluminescent nanowire arrays. Preferably, the cathode or electron emitter comprises carbon nanotubes (CNT) dispersed or arrayed on the one surface of a Cu plate or grid which can be endowed with a plurality of posts or Cu nanorod array as needed. The CNT orientation and spatial arrangement can aid in optimizing the emitted electron flux.

Other nanostructured electron emitters can also be used to form the field emitter cathode. Preferred nanostructured electron emitters include vertical CNT, SiNi nanowires, and ZnO nanowires grown on metal plates, e.g., Al, Au, Cr, Cu, Indium Tin Oxide. Other suitable electron emitters include $LaB_6$, Cobalt silicide nanowires, and $In_2O_3$ nanowires, Si nanowires. Other suitable nanotube electron emitters include Cobalt silicide nanotubes, $In_2O_3$ nanotubes, Nickel Silicide nanotubes, Si nanotubes, ZnO nanotubes. Metal nanowire/nanotubes in the vertical or lateral arrangement on a conducting matrix, such as Cu grid, ITO glass, ZnO/glass, can also be used. It should be noted that certain materials, for example, ZnO nanowires, can serve as a nanostructured electron emitter on the cathode and as a light emitting nanostructured material (in this instance emitting UV photons) on the anode. In certain preferred embodiments, the same nanostructured material is part of the anode and the cathode and performs the required role of emitting photons and electrons, respectively.

The anode in preferred embodiments preferably includes a plurality of light emitting semiconductor nanowires arranged in an array or randomly distributed on a metal electrode. The nanowires can be grown by any of the methods currently available (and methods that may be developed in future), including Chemical Vapor Deposition (CVD), Metal Organic Chemical Vapor Deposition (MOCVD), Molecular and Chemical Beam Epitaxy (CBE and MBE) (with or without metal, or oxide seeding materials), HVPE (hybrid vapor phase epitaxy), solution syntheses, and template-assisted electrochemical syntheses etc. Nanowire growth using CVD, MOCVD, MBE, etc. can be carried out directly on conducting substrates, such as indium titanium oxide (ITO), FTO, degenerated doped Si, metal (Cu), etc. Solution growth can also done using metal coated substrates that may later serve as electrodes. Nanowires can be produced with controlled dimensions, have tunable conductivities, tunable band-gaps and flexible surface chemistries. A typical nanowire has a length that can be in the range of 1-100 μm and a diameter in the range of 2-100 nm. Long an narrow nanowires are preferred to provide a large surface for electron absorption.

The nanostructured electroluminescent materials of the anode are preferably, but not limited to, p-type semiconductors. Exemplary p-type materials would be p-type GaN and p-type ZnO. GaN and ZnO have a direct band gap of about 3.4 eV and emit in the UV. The UV electroluminscent emission can be used directly for hygiene and germicidal applications such as water purification, and also as light source excitation for RGB phosphors allowing color tuning towards application in electric signs, general lighting, etc.

Preferred semiconductor nanostructure materials for the anode include nanowires formed from AlGaN, GaN, InGaN, AlInGaN, InN, AlGaInP, AlGaAs, GaAs, AlInGaAs, AlIn-GaAsP, AlInGaAsN, AlInGaPN, CdSe, CdS, CdTe, CdSSe, CdSSeTe, ZnS, ZnSe, ZnTe, ZnCdS, ZnCdSe, ZnCdTe, ZnO, ZnCdO, MgZnO, ZnBeO, ZnMgCdO, ZnMgBeO, etc. The choice of materials for nanowire growth is also includes III-nitrides, such as GaN, InGaN, AlInN, AlGaN, AlInGaN; III-arsenides and phosphides, e.g., GaAs, InGaAs, AlInGaAs, InP, InGaP, AlInGaP, InAsP, AlInGaAsP, AlInGaAsPN (dilute nitride); II-VI semiconductor, such as ZnO, CdSe, ZnS, BeZnCdO, MgZnCdO, ZnCdSe, ZnCdS, ZnCdTe, ZnSSeTe; and even IV semiconductors, such as Si and SiGe nanostructures, and other oxide semiconductors, such as $V_2O_5$, etc. Within certain compositional systems like the alloy $In_{1-x}Ga_xN$, varying the Ga fraction x allows adjustment of the band gap to cover energies from IR through visible to UV. For white light, the nanowire phosphors preferably emit an optimal combination of R and G light, e.g. $In_{1-x}Ga_xN$ nanowires with x close to 0.5. Nanowires with uniform composition from group III-V and II-VI direct bandgap semiconductor materials can be synthesized with control over key properties in a predictable manner during synthesis. Moreover, the controlled elaboration of nanowire structures through the growth of nanowire superlattices, radial heterostructures, and branched heterostructures enable a combination of enhanced functions and unique materials. Tunability of emission color can be achieved by changing the composition (alloying) in the nanowire and heterostructures, such as AlInGan, AlGaInAsP, MgCdZnO, CdZnSSeTe, etc. Organic nanowire semiconductors such as [Ru(bpy)3]2+(PF6−)2, where bpy is 2,2'-bipyridine, and conjugated polymers, such as Poly (Phenylene Vinylene) (PPV), polyparaphenylene (PPP), Polyfluorene (PF), etc. and derivatives.

The emission is typically UV/blue from wide band gap materials, e.g., GaN, ZnO, etc., and green/red from narrower bandgap semiconductors such as InGaN, CdSe, AlInGaP, etc. Band gap engineering allows tuning of the emitted color (UV, VIS, IR), color mixing (white), and color quality control (color rendering index and color temperature). The semiconductor light emitting nanostrucutured materials of the anode provide what is effectively a large junction area or active recombination region that is formed by the entire body of the nanostructures or portions thereof. The semiconductor nanowires as light-emitting materials for the anode offer small-size features (diameters <500 nm), narrow size distribution, non-agglomeration, and a large surface/volume ratio. A variety of heterostructures or superlattices provide excellent charge dissipation (conductivity) as compared to conventional oxide phosphors. The nanostructures may take the form of quantum dots, nanowires, nanotubes, branched tree-like nanostructure, nanoflower, tetrapods, tripods, axial heterostructures and core-shell (radial) heterostructures. The choice of materials for nanostructure growth is broad, allowing simple and easy tuning of emitted color (UV, RGB, IR), color mixing (white), and color quality control (color rendering index and color temperature), etc. In the exemplary case of GaN, these benefits are of particular significance because fabrication requires expensive substrates (e.g., SiC, sapphire) when growing GaN in thin film rather than nanowire form. GaN nanowires are more robust compared to other types of semiconducting nanowires. Further, easy color tuning is possible through the syntheses of InGaN nanowires of GaN/InGaN heterostructures in nanowires for green and red emission. In devices of the invention, the semiconductor nanowires provide electroluminescence following electron bombardment of nanowire with electrons which results in radiative electron-hole recombination. Semiconductor nanowires for particular applications of the invention can be selected according to the capabilities of different growth methods, versatile material choices, and heterostructure formation, bandgap tuning, etc.

In another exemplary case of ZnO, materials costs are low and involve no toxic precursors, nanowires can be easily synthesized from chemical vapor deposition (CVD) and solution methods, and single crystal nanowires can grow from virtually any substrate. Ease of further color tuning is provided via alloying with Mg or Be and Cd in the case of ZnO which allows tuning up to UV (ZnMgO and ZnBeO) or down to the visible spectrum (ZnCdO), doping with rare earth ions, such as Pr3+, Eu3+, Er3+, etc., during synthesis, e.g., nanowire growth from solution, which then allows easy color tuning from UV to IR. N type ZnO is used in preferred embodiments as both the nanostructured electron emitter of the cathode and the nanostructured light emitter of the anode.

As another example, by using only wide bandgap semiconductor nanostructures devices can be produced that only emit UV light. UV light sources have many important applications. An example application is as a light source for water treatment. By using semiconductor materials that emits in the IR (1300 nm or 1550 nm), a device of the invention is useful as a light source for many telecommunications applications.

Particular example structures include a nanowire that, in the radial direction, forms cylindrical shells of different composition or p/n doping which allow photon confinement in quantum wells to enhance emission efficiency and enable color tuning/mixing. Another possibility in the axial direction is forming end to end rods of different composition or p/n doping which likewise allow enable color tuning/mixing. Another possibility in the form of branches, that is, daughter nanowires growing perpendicularly from the parent nanowires which further increases the surface area for electron injection and e-h recombination, thus also enhancing emission efficiency, in addition to color tuning/mixing Preferably, the nanostructured p-type GaN is an array or distribution of p-type GaN nanowires grown by chemical vapor deposition method or metal-organic chemical vapor deposition, MBE, etc. on a sapphire substrate with Ni, Au as catalysts and Mg as a dopant (dimethyl magnesium). Other light emitting nanowires include or p-GaN or p-InGaN shells coated on GaN nanowires. Light emitting heterostructures can also be used such as n-GaN/InGaN/p-GaN core/sheath nanowire, or n-GaN/(InGaN/GaN)n MQW/p-GaN core/mutliple shell nanowire heterostructres.

In a preferred embodiment, the anode includes light emitting nanostructured p-type ZnO in the form of an array of p-type ZnO nanowires grown by CVD, MOCVD, MBE method on sapphire, glass, etc. substrate with nitrogen, or phosphorus, or arsenic, or indium/nitrogen, gallium/nitrogen, etc. as dopant. Alternatively, n-ZnO/p-ZnO, ZnO/CdZnO/p-ZnO, Zn)/(CdZnO/ZnO)n MQW/p-ZnO core/shell or core/multiple shell nanowire heteorstructures, etc can also be utilized.

Advantageously, the electroluminescent nanostructured materials used in the anode have a small form factor, large surface area and high emission efficiency. The footprint of the cathode assembly and anode assembly can be as small as 20 um×20 um for a single lighting device unit or module and can be scaled up to 1000 mm×1000 mm by making larger area device units and/or tiling or gathering several units together to form arrays and other structures. Moreover, the units can be thought of as pixels which can have different colors, sizes, etc and thus form a display panel. Therefore, only small volumes of relatively inexpensive material are needed to fabricate injection light emitting diode lighting devices. The anode can take a variety of different geometries, including, but not limited to, planar, cylindrical, interdigitated plates, etc. with size/area as desirable. There is a low fabrication cost due to materials, synthetic processes and handling that are cheaper than in the thin film case and given that single crystal nanowire growth of semiconducting material is not limited by lattice matched substrates as for thin films and can sometimes be done directly on conductors, from low cost CVD and solution synthesis, etc.

Preferred semiconductor light emitting nanostructures are areas of vertical or horizontal semiconductor nanowires 30. The separate areas of nanowires 30 preferably include different types of nanowires that provide a combined contribution of photos that covers a large portion of the visible spectrum to produce white light. The nanowires 30 are disposed on a transparent electrode 36, such as an indium tin oxide electrode on a transparent substrate 34, e.g. a glass substrate. An example full spectrum emission device of the invention uses an anode including combination of red emitting, blue emitting, and green emitting nanowires on an indium tin oxide electrode that is formed on a glass substrate. A combination of AlInGaP(R)/InGaP(G)/InGaN(B) nanowires provides full spectrum emissions.

The FIG. 1A embodiment shows the anode 16 and cathode 14 as axially disposed parallel plates (disposed in parallel or coincident with a principle axis of the lighting device), but many other physical arrangements can be used so long as a gap the permits the required injection of electrons from the cathode 14 to the semiconductor light emitting nanostructures of the anode 16 and the electrical isolation of the anode 16 and cathode 14. It should also be noted that multiple sets of anodes and cathodes can be used in a device, and devices of the invention can include multiple vacuum enclosures with separate sets of anode(s) and cathode(s). One or multiple cathode-anode sets can be used per device such that in the two set case, the transparent ITO substrate of the anode faces outward to maximize the exiting light and the two sets are electrically connected in parallel and wired to a transformer operating at the same frequency as the input AC voltage (e.g., 100-220V/50-60 Hz wall power). In the single set case, the ITO substrate likewise preferably faces outward to maximize the exiting light and the cathode-anode unit is wired to a transformer operating at a frequency higher than the input AC voltage. The transformer can be a type similar used for backlit displays employing cold cathode fluorescent lamps (CCFLs) with >600V voltage. The voltage across the gap is adjustable within a certain range to allow for dimming.

Figure 1B:
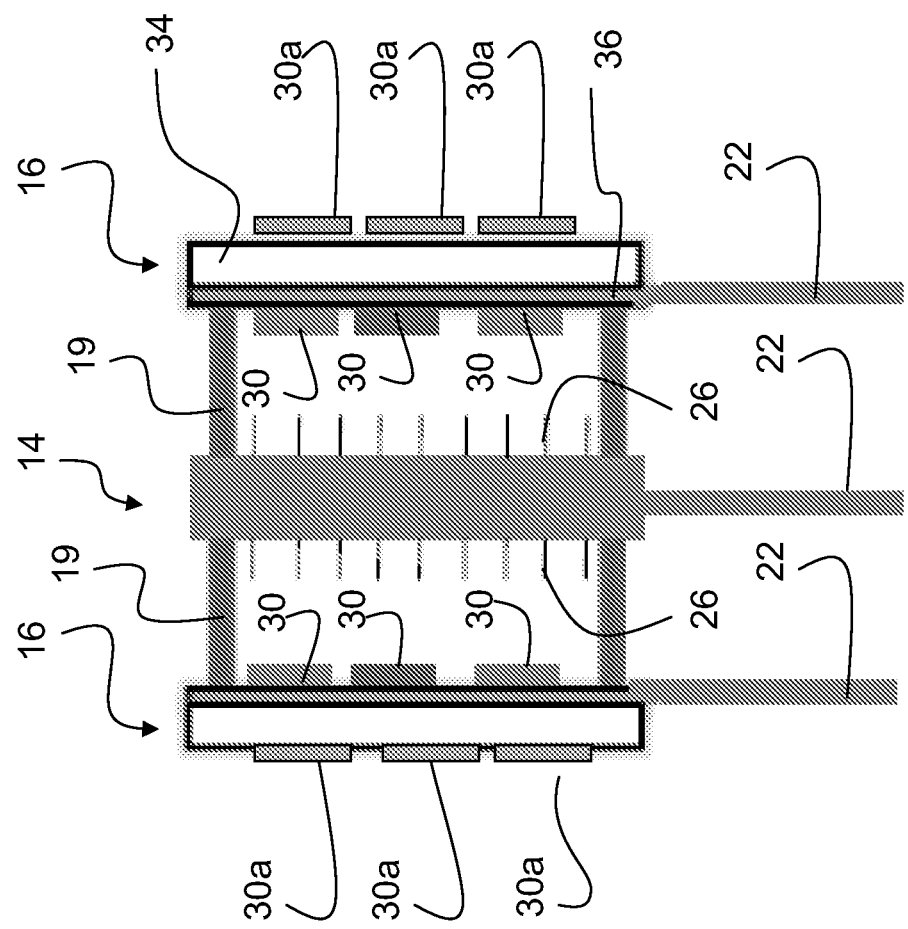

FIG. 1B illustrates an example dual anode arrangement that can be used in the FIG. 1A device. References numbers from FIG. 1A are used to label like parts. In addition, the FIG. 1A arrangement shows that the backside of the anode(s) can include additional light emitting semiconductor nanostructures 30a. The outward facing light emitting semiconductor nanostructures 30a provide additional brightness and can also act as wavelength converters.

Figure 2:
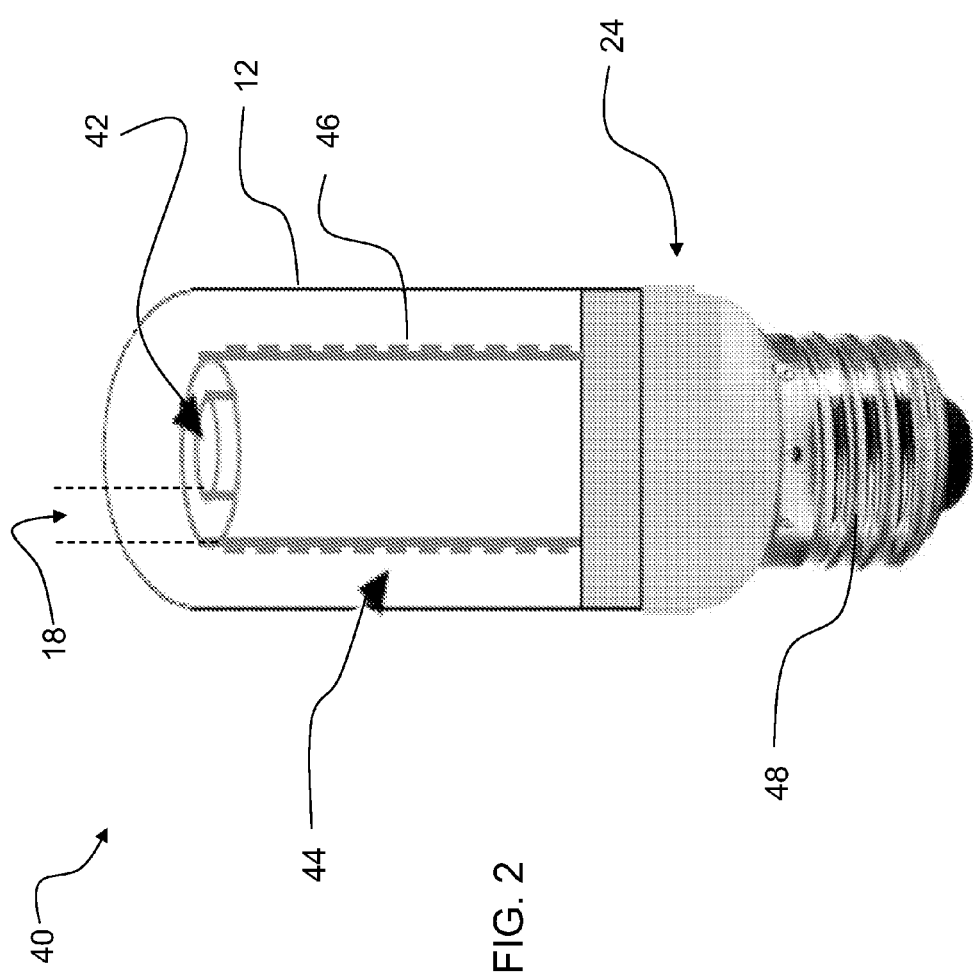

FIG. 2 is a schematic illustration of another preferred embodiment lighting device 40 that uses a concentrically arranged field emission cathode 42 and a semiconductor nanostructure anode 44. The anode 44 is transparent to electrons and semiconductor light emitting nanostructures 46, such as nanowires, can be disposed on an outer surface of the anode 44. A traditional screw-in socket connection 46 permits the lighting device 40 to be used in a traditional light socket. FIG. 3 is a schematic illustration of yet another preferred embodiment lighting device 50 that uses a radially disposed parallel plate field emission cathode 52 and a semiconductor nanostructure anode 54. Vertical semiconductor nanowires 56 are illustrated as preferred light emitting structures of the anode, and the nanowires 56 are formed on plate electrode 58, such as an indium tin oxide electrode. Carbon nanotubes 60 are illustrated as field emission structures formed on a cathode electrode 62. The cathode 52 and anode 54 are cantilevered from one end in FIG. 2.

The FIGS. 1-3 embodiments will be appreciated by artisans to illustrate a few exemplary structures. Many different sized and shaped vacuum enclosures and anode and cathode shapes and structures are possible with electron injection light emission anode devices of the invention. While the semiconductor light emitting nanostructures can be selected to provide a phosphor like function to produce a desired bandwidth of emission (including broad spectrum white emissions), conventional phosphors can also be used such as on the interior surface of the vacuum enclosure 12. FIG. 3 illustrates such phosphors 64 formed as a layer on the interior surface of the vacuum enclosure 12. In an example embodiment, blue/UV light emitting nanowires form part of the anode and an inner wall of vacuum tube covered with green, red, and/or yellow fluorophors (nanowires, quantum dots, conventional phosphors, etc.).

The semiconductor nanowires that are used as part of the light emitting anode of preferred embodiment devices can include vertical and horizontal nanowires, including nanowire heterostructures (such as core-shell structures) that are highly luminescent in response to the injection of an electron and application of a voltage differential as in the preferred embodiment devices of FIGS. 1-3. The tuning of composition and formation of heterostructures in the nanowires and the use of multiple types or areas of nanowires enables the tuning of emission color spans over the entire electromagnetic spectra.

Figure 4E:
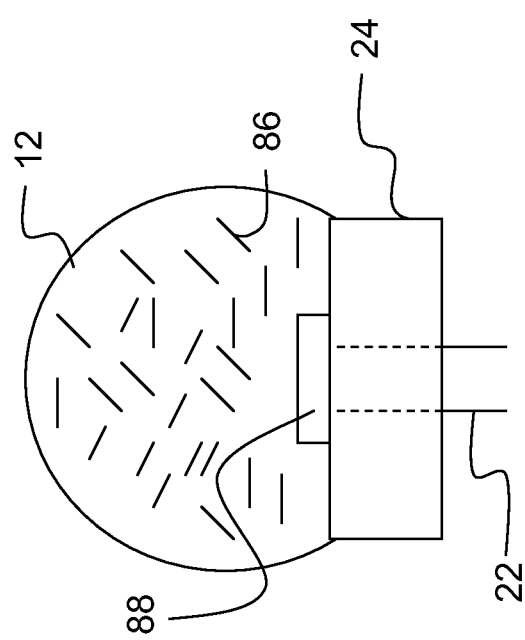
FIG. 4E illustrates a lighting device that uses structures such as the FIGS. 4A-4D structures as phosphors with a conventional CFL light source.

FIGS. 4A-4D illustrate different types of light emitting nanowire heterostrucures that can be used in the anode of devices of the invention. FIG. 4A shows a core/shell/shell nanowire structure. The heterostructure includes a core 70, e.g., n-GaN, a first shell 72, e.g., InGaN, and a second shell 74, e.g., p-GaN, defining a heterojunction between the core 70 and the first shell 72 and another between the first shell 72 and the second shell 74. FIG. 4B shows and axial heterostructure nanowire with alternating sections 76, 78 of different materials, e.g., GaN/InGaN, defining a heterojunction at each junction of alternating sections, 76, 78. FIG. 4C shows a branched nanowire structure that includes a trunk nanowire 80 and branch nanowires 82. FIG. 4D shows hyper-branched nanowire structure that includes secondary branches 84.

A formation method for the FIG. 4A type structure involves forming, in the radial direction, of cylindrical shells of different composition or p/n doping. This can be achieved by first forming uniform nanowires of a desired composition will be grown first, e.g., using MOCVD, and then followed by preferentially conformal shell growth by altering the synthetic conditions to favor homogeneous vapor phase deposition on the nanowire surface. Subsequent introduction of different reactants and/or dopants produces multiple shell structures of nearly arbitrary composition.

A formation method for the FIG. 4B axial direction structure, one-dimensional axial growth is achieved when reactant activation and addition occurs at the catalyst site and not on the nanowire surface. The approach to axial nanowire heterostructure growth can exploits the nanocluster catalyzed nanowire synthesis method where growth time controls the length of semiconductor nanowires and different reactants required for nanowire growth are introduced by sequential nanowire growth.

A formation method for the branched structures of FIGS. 4C and 4D, forms nanowires of a desired composition, e.g., using MOCVD of HVPE (hybrid vapor phase epitaxy), and then subsequent growth of one or multiple generation of branches with different composition, doping, or heterostructure, are performed with or without such applied prior to each branch growth. The nanowire trunk and/or the branches and can be uniform, axial or radial heterostructures. The FIGS. 4C and 4D structures further increase the surface area for electron injection and e-h recombination, thus also enhancing emission efficiency, in addition to color tuning/mixing.

In addition to having application as the nanostructured light emitting anode of an electron injection electroluminescence light emitting device of the invention, the nanowires structures of FIGS. 4A-4D can also be used as general phosphors for converting the wavelength of light in other applications. Embodiments of the invention also include usage of nanostructured semiconductor materials as phosphors for conventional planar LED light sources, nanowire array light emitting diodes and compact fluorescent lights CFL, for example. For the use in conventional planar LEDs or other light sources, the nanostructures may take the form of quantum dots, nanotubes, branched tree-like nanostructure, nanoflower, tetrapods, tripods, axial heterostructures nanowires heterostructure. Additional preferred embodiments include nanostructures phosphors such as those disclosed in M. S. Gudiksen, L. J. Lauhon, J. Wang, D. Smith, and C. M. Lieber "Growth of Nanowire Superlattice Structures for Nanoscale Photonics and Electronics," Nature 415, 617-620 (2002) (axial heterostructures); L. J. Lauhon, M. S. Gudiksen, D. Wang, and C. M. Lieber "Epitaxial Core-Shell and Core-Multi-Shell Nanowire Heterostructures," Nature 420, 57-61 (2002) (core/shell heterostructures); D. Wang, F. Qian, C. Yang, Z. Zhong and C. M. Lieber, "Rational Growth of Branched and Hyperbranched Nanowire Structures," Nano Lett. 4, 871-874 (2004)(branch nanowire heterostructures); Wei-Tang Yao, et. al., "Architectural Control Syntheses of CdS and CdSe Nanoflowers, Branched Nanowires, and Nanotrees via a Solvothermal Approach in a Mixed Solution and Their Photocatalytic Property", J. Phys. Chem. B, 2006, 110 (24), pp 11704-11710 (nanoflower structures); Min-Yeol Choia, Hyun-Kyu Parka, Mi-Jin Jina, Dae Ho Yoonb and Sang-Woo Kim, "Mass production and characterization of free-standing ZnO nanotripods by thermal chemical vapor deposition," Journal of Crystal Growth Volume 311, Issue 3, 15 Jan. 2009, Pages 504-507 (nano tripods); Zhao Y N, Cao M S, Jin H B, Shi X L, Li X, Agathopoulos S., "Combustion oxidization synthesis of unique cage-like nanotetrapod ZnO and its optical property," J Nanosci Nanotechnol. 2006 Aug. 6(8):2525-8; Young-wook Jun, Jin-sil Choi, and Jinwoo Cheon, "Shape Control of Semiconductor and Metal Oxide Nanocrystals through Nonhydrolytic Colloidal Routes," Angew. Chem. Int. Ed. 2006, 45, 3414-3439 (2006); (tripods); Qi Pang, et. al., "CdSe Nano-tetrapods: Controllable Synthesis, Structure Analysis, and Electronic and Optical Properties", Chem. Mater., 2005, 17 (21), pp 5263-5267; B. I. Kharisov, "A Review for Synthesis of Nanoflowers", Recent Patents on Nanotechnology, 2(3) 2008, 190-200.

The structures of FIGS. 4A-4D are high efficiency, and can advantageously contain different materials or dopings to realize, for example, a wide spectrum of emission from the single type of nanostructure. FIG. 4E shows a light device of the invention. Phosphors 86 formed on the interior of the enclosure are nanostructures such as those shown in FIGS. 4A-4D and discussed here. A light source 88 is illustrated schematically, and can comprise an LED, and LED array, a CFL, etc. Fluorescent and Compact Fluorescent Lamps (CFLs) typically utilize UV light from excited mercury atoms to stimulate fluorescence from phosphors and produce visible light.

The phosphors presently in use are constituted by varying blends of metallic and rare-earth phosphor salts. These phosphors can be replaced by nanowire phosphors that can be combined as uniform or heterostructured nanowires, to emit all across the visible spectrum for improved color tuning, color temperature and color rendering index. Use of the high efficiency nanowire phosphors can also lead to improved efficiency, color quality, and lifetimes relative to current fluorescent and CFL products. While the nanostructure phosphors 86 shown on the interior of the enclosure 12, they can also be formed on an electrode of a light source that is used. The highly efficient electroluminescent nanostructures offer the advantages of high emission and light extraction efficiency, improved color tuning/versatility, color temperature and color rendering index, etc as cited above. Because a variety of nanostructures having different compositions, doped types and heterostructures can be readily grown on a conducting transparent substrate (e.g., ITO, ZnO), such an electrode can be directly used as one electrode for a lighting device. Moreover, electroluminescent nanowires offer the possibility of higher resolution (>>10001 pi) which can be exploited for display purposes.

Figure 5:
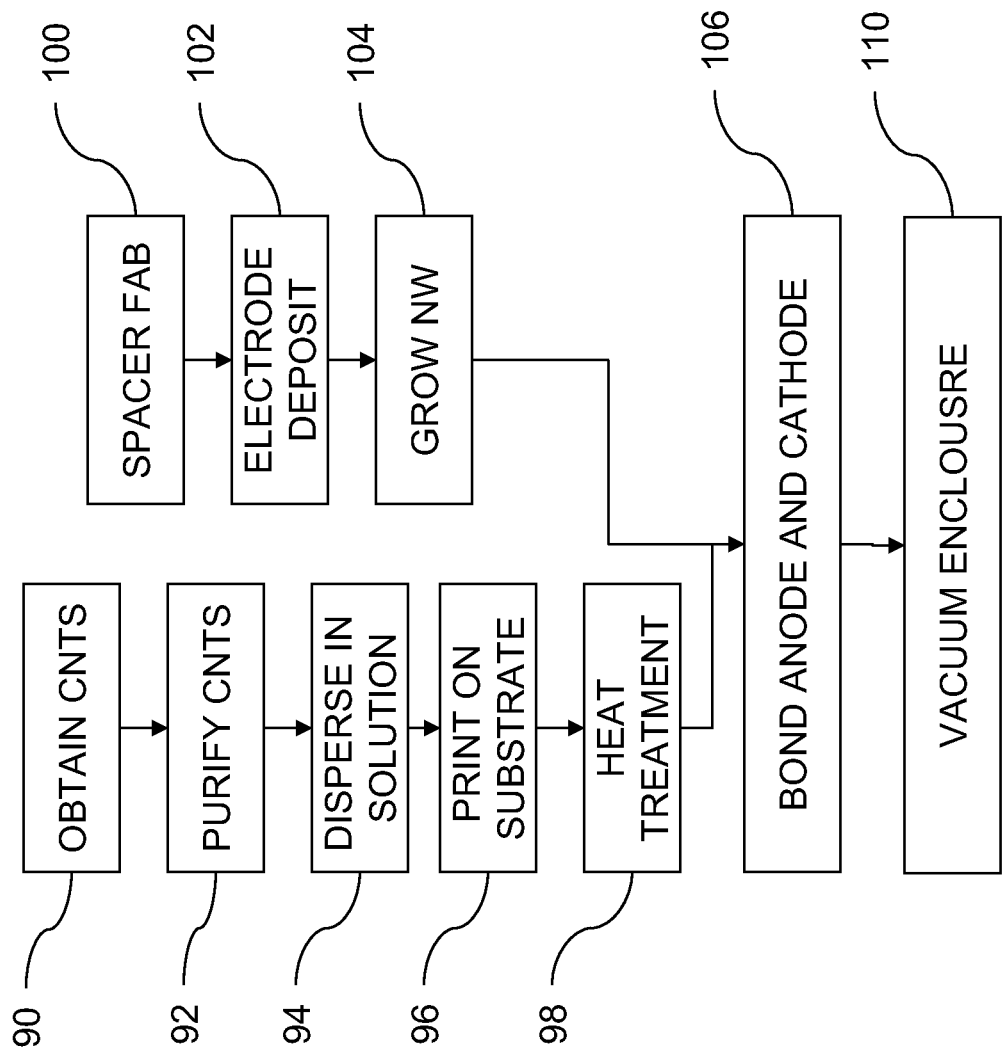
FIG. 5 illustrates a preferred embodiment fabrication process for forming a light emitting device such as shown in FIG. 1A.

FIG. 5 illustrates a preferred method for forming a carbon nanotube cathode and complete device having a nanowire anode in accordance with FIG. 1A. Carbon nanotubes are obtained 90, such as by manufacturing or from a commercial source. The carbon nanotubes are purified 92 to remove amorphous carbons. The carbon nanotubes are dispersed in solution, e.g., isopropyl alcohol (IPA) 94 with an organic binder. The organic binder, for example, can be a photosensitive organic binder based on acrylate or cellulose (such as nitrocellulose). Conductive fillers, e.g., $SnO_2$, and adhesion improvement materials, e.g., glass frit powders, can also be added to the solution. The carbon nanotubes are then printed on a substrate 96. The nanowires can be vertically aligned after printing, such as by adhesive taping, mechanical rubbing (such as with a soft rubber roller), through field emission processes (a few cycles run in a vacuum), or by laser radiation. Preferred substrates include metal (Cr, Al, Au, ITO) patterned glass. Patterning allows the fabrication of arrays of pixels for displays, for example, while a solid metal layer can serve as an electrode for general lighting, for example. Heat treatment 98 removes the organic binder. The heat treatment can be a multistep process. For example, it can include a relatively low temperature drying step, e.g. a 120° C., followed by a two-step firing in 350° C. in air and then at 400° C. in nitrogen gas. A typical initial print of about 5-8 μm will be reduced to about 2 μm after heat treatment. A separate process forms spacers 100 on a substrate, such as a glass substrate. An electrode, e.g., indium tin oxide, is deposited 102 on the substrate. Light emitting nanowires are then grown vertically or horizontally on the electrode 104. The anode and cathode are bonded 106 with the gap between them being set by the spacers. The device is then completed with formation attaching the anode and cathode to electrodes and forming the vacuum enclosure 110.

Figure 6:
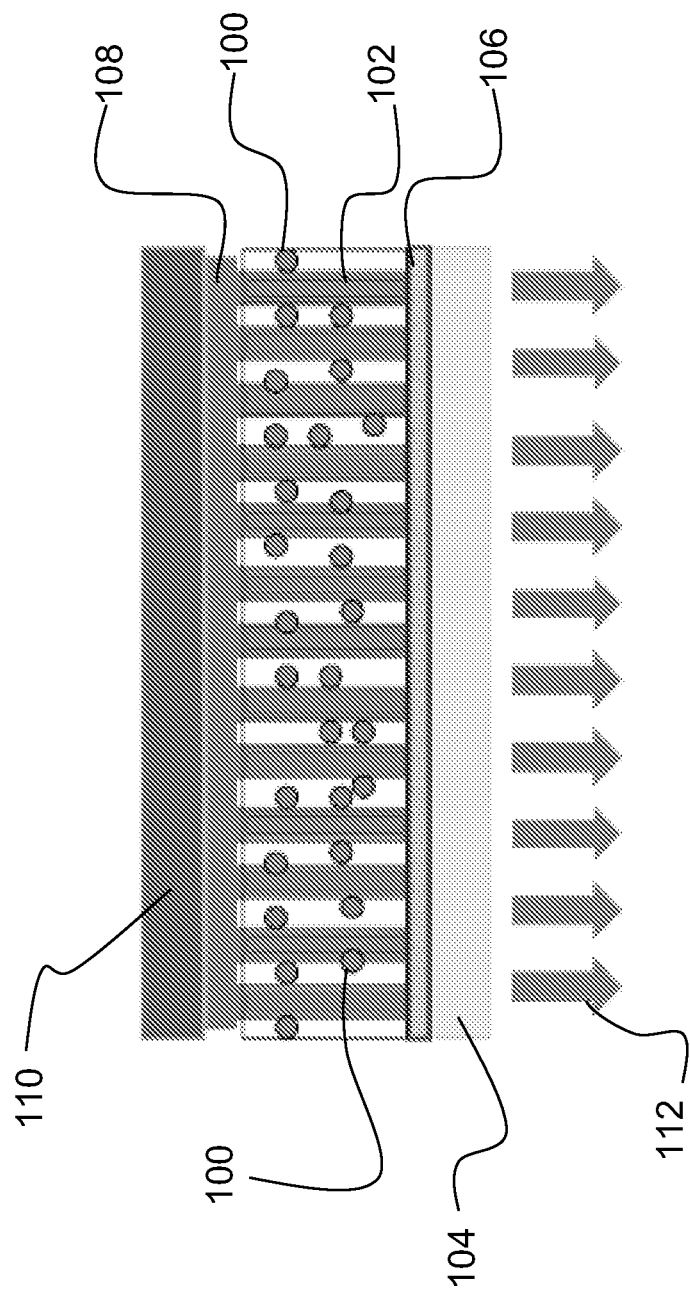
FIG. 6 illustrates a preferred embodiment lighting device having nanostructure phosphors and a nanowire array LED light source.

Another preferred light emitting device is shown in FIG. 6, and uses light emitting nanostructures 100 to provide a selected wavelength range of emissions in a vertical nanowire array 102 light emitting device. The vertical nanowire array 102 can be formed with different materials and on substrates by nanowires formation methods known in the art. A particular preferred embodiment device in accordance with FIG. 6 is formed by first, on transparent sapphire or quartz substrate 104, a ZnO single crystal thin film 106 is grown such as from a solution method. Nano-imprinting lithography (NIL) is employed to pattern nickel metal particles and SiNx mask templates. The nanowires 102, such as GaN nanowires are then grown by a suitable method such as via either vapor-liquid-solid mechanism (VLS) or selective area MOVPE method. Heterostructures are formed around GaN nanowire cores—LED structures may be grown with MQW structures and p-GaN (or P—AlGaN) contact layers. The nanowire LED is encapsulated by dispersing nanowire phosphors, such as FIGS. 4A-4D structures. The top of the nanowires 102 are planarized/etched to expose the tips of the nanowires 102. Metal is evaporated as contact to the p-GaN shell and the device is completed by bonding a substrate with a top contact 108, such as indium tin oxide and a reflective surface or mirror 110. Light 112, such as full spectrum white light, is emitting from the bottom portion of the view in FIG. 6. Additional preferred embodiment devices in accordance with FIG. 6 for arrays of nanowires according to the methods and devices disclosed in PCT/US2009/062356, which was filed on Oct. 28, 2009 and is entitled Vertical Group III-V Nanowires on Si, Heterostructures, Flexible Arrays and Fabrication. Another preferred embodiment uses the nanostructured phosphors with an LED light source such as disclosed in PCT/US07/88001, filed Dec. 18, 2007, and entitled Nanowire Array-Based Light Emitting Diodes and Lasers.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A light emission device, comprising:
   a vacuum enclosure;
   a field electron emitter cathode within the vacuum enclosure; and
   an anode within the vacuum enclosure separated by a gap from said cathode and disposed to receive electrons emitted from said cathode, the anode including light emitting semiconductor nanowires that accept injection of electrons from the cathode and generate photons in response to the injection of electrons.

2. The device of claim 1, further comprising external electrode contacts for placing a voltage differential across said anode and cathode to stiumlate electron emissions from said cathode and resultant photon emissions from said light emitting semiconductor nanowires.

3. The device of claim 2, further comprising a transformer for converting the voltage differential.

4. The device of claim 3, further comprising a base supporting the vacuum enclosure and housing said transformer.

5. The device of claim 4, wherein said vacuum enclosure, base and external electrode contacts are configured in the form of a standard incandescent light bulb or another traditional light bulb.

6. The device of claim 5, wherein said base comprises a traditional screw-in socket connection that screws into a traditional light socket.

7. The device of claim 1, wherein said gap is in the range of approximately 50-200 microns.

8. The device of claim 1, wherein the gap is approximately 110 microns and the field electron emitter cathode comprises carbon nanotubes.

9. The device of claim 1, further comprising a spacer to set the gap between the anode and the cathode.

10. The device of claim 1, wherein said light emitting semiconductor nanowires comprise a plurality of types of nanowires that emit photons in different wavelength bands.

11. The device of claim 1, wherein said anode and cathode comprise parallel plates separated by said gap.

12. The device of claim 1, wherein said anode and cathode are concentrically arranged and separated by said gap.

13. The device of claim 1, wherein said anode comprises a transparent substrate, an electrode on said substrate and said light emitting semiconductor nanowires are disposed on said electrode.

14. The device of claim 1, wherein said semiconductor nanowires comprise core shell heterostructure nanowires.

15. The device of claim 1, wherein said semiconductor nanowires comprise axial heterostructure nanowires.

16. The device of claim 1, wherein said semiconductor nanowires comprise trunk and branch heterostructure nanowires.

17. The device of claim 1, wherein said semiconductor nanowires comprise Group III-V nanowires.

18. The device of claim 17, wherein said semiconductor nanowires comprise Group III-nitride nanowires.

19. The device of claim 17, wherein said semiconductor nanowires comprise Group III-arsenide nanowires.

20. The device of claim 17, wherein said semiconductor nanowires comprise Group III-phosphide nanowires.

21. The device of claim 1, wherein said semiconductor nanowires comprise Group II-VI nanowires.

22. The device of claim 1, wherein said semiconductor nanowires comprise Group IV nanowires.

23. The device of claim 1, wherein said semiconductor nanowires comprise alloyed semiconductor nanowires.

24. The device of claim 1, wherein said semiconductor nanowires comprise doped nanowires.

25. The device of claim 1, wherein said semiconductor nanowires comprise an array or distribution of doped p-type GaN nanowires on a sapphire substrate.

26. The device of claim 25, wherein said p-type GaN nanowires are doped with Mg.

27. The device of claim 1, wherein said semiconductor nanowires comprise p-type ZnO nanowires doped with one of Mg, Be and Cd.

28. The device of claim 1, wherein said semiconductor nanowires comprise a plurality of different types of nanowires having different emission wavelength ranges.

29. The device of claim 1, further comprising semiconductor light emitting nanostructures on a backside of said anode.

30. The device of claim 29, wherein said semiconductor light emitting nanostructures comprises semiconductor nanotubes.

31. A light emission device, comprising:
a vacuum enclosure;
a field electron emitter cathode within the vacuum enclosure; and
an anode within the vacuum enclosure separated by a gap from said cathode and disposed to receive electrons emitted from said cathode, the anode including light emitting semiconductor nanowires that accept injection of electrons from the cathode and generate photons in response to the injection of electrons, wherein said cathode includes a backside that emits electrons, the device further comprising an additional anode within the vacuum enclosure separated by a gap from the backside of said cathode and disposed to receive electrons emitted from the backside of said cathode, the additional anode including semiconductor light emitting nanostructures that accept injection of electrons from the cathode and generate photons in response to the injection of electrons.

32. The device of claim 1, further comprising phosphor disposed on an interior surface of said vacuum enclosure.

33. A method for providing light emission, the method comprising steps of:
stimulating an electron emitter to emit electrons into a surrounding environment;
accepting the electrons from the environment, by light emitting semiconductor nanowires, to induce an electroluminescence response from the light emitting semiconductor nanowires.

* * * * *

UNITED STATES PATENT AND TRADEMARK OFFICE
CERTIFICATE OF CORRECTION

PATENT NO. : 8,847,476 B2  
APPLICATION NO. : 13/132297  
DATED : September 30, 2014  
INVENTOR(S) : Deli Wang Page 1 of 1

It is certified that error appears in the above-identified patent and that said Letters Patent is hereby corrected as shown below:

In the Specification:

Col. 5, line 49   Before "done" please insert --be--.

Col. 6, line 4    After "growth" please delete "is".

Col. 8, line 43   After "similar" please insert --to that--.

Col. 8, line 48   Please delete "References" and insert --Reference-- therefor.

Col. 9, line 1    Before "plate" please insert --a--.

Col. 9, line 61   Please delete "exploits" and insert --exploit-- therefor.

Col. 10, line 5   After "branches" please delete "and".

Signed and Sealed this  
Second Day of June, 2015

Michelle K. Lee  
*Director of the United States Patent and Trademark Office*